United States Patent
Weatherspoon et al.

(10) Patent No.: US 9,655,236 B2
(45) Date of Patent: May 16, 2017

(54) METHOD TO MAKE A MULTILAYER CIRCUIT BOARD WITH INTERMETALLIC COMPOUND AND RELATED CIRCUIT BOARDS

(71) Applicant: HARRIS CORPORATION, Melbourne, FL (US)

(72) Inventors: Michael Raymond Weatherspoon, West Melbourne, FL (US); Louis Joseph Rendek, Jr., Melbourne, FL (US); Lawrence Wayne Shacklette, Melbourne, FL (US); Casey Philip Rodriguez, Indialantic, FL (US)

(73) Assignee: HARRIS CORPORATION, Melbourne, FL (US)

( * ) Notice: Subject to any disclaimer, the term of this patent is extended or adjusted under 35 U.S.C. 154(b) by 136 days.

(21) Appl. No.: 14/532,224

(22) Filed: Nov. 4, 2014

(65) Prior Publication Data
US 2015/0053468 A1   Feb. 26, 2015

Related U.S. Application Data

(62) Division of application No. 13/242,155, filed on Sep. 23, 2011, now Pat. No. 8,904,632.

(51) Int. Cl.
*H05K 1/11* (2006.01)
*H05K 1/02* (2006.01)
(Continued)

(52) U.S. Cl.
CPC ............. *H05K 1/0298* (2013.01); *H05K 1/09* (2013.01); *H05K 1/116* (2013.01); *H05K 3/4614* (2013.01);
(Continued)

(58) Field of Classification Search
CPC ........ H05K 1/0298; H05K 1/09; H05K 1/116; H05K 3/4614; H05K 3/429; Y10T 29/49117; Y10T 29/49124
(Continued)

(56) References Cited

U.S. PATENT DOCUMENTS 4,788,766 A   12/1988  Burger et al.
5,191,174 A   3/1993   Chang et al.
(Continued)

FOREIGN PATENT DOCUMENTS

WO   2010070771   6/2010

OTHER PUBLICATIONS

Lee et al., "Are Intermetallics in Solder Joints Really Brittle?", 2007 Electronic Components and TechnologyConference, pp. 648-652.
(Continued)

*Primary Examiner* — Tremesha S Willis
(74) *Attorney, Agent, or Firm* — Allen, Dyer, Doppelt, Milbrath & Gilchrist, P.A. Attorneys at Law

(57) ABSTRACT

A method for making a multilayer circuit board from circuit board layers, each including a dielectric layer and conductive traces thereon including a first metal. The method includes forming a through-via in a first circuit board layer, plating the through-via with the first metal, and coating a second metal onto the first metal of the first circuit board layer, the plated through-via, and the first metal. The method also includes aligning the first and second circuit board layers together so that the plated through-via of the first circuit board layer is adjacent a feature on the second circuit board layer, and heating and pressing the aligned first and second circuit board layers so as to laminate the dielectric layers together and form an intermetallic compound of the first and second metals bonding adjacent metal portions.

13 Claims, 4 Drawing Sheets

(51) Int. Cl.
*H05K 3/46* (2006.01)
*H05K 1/09* (2006.01)
*H05K 3/42* (2006.01)

(52) U.S. Cl.
CPC ..... *H05K 3/429* (2013.01); *H05K 2201/0141* (2013.01); *H05K 2201/09545* (2013.01); *H05K 2203/061* (2013.01); *Y10T 29/49117* (2015.01); *Y10T 29/49124* (2015.01); *Y10T 29/49126* (2015.01); *Y10T 29/49155* (2015.01); *Y10T 29/49165* (2015.01)

(58) Field of Classification Search
USPC ................. 174/262, 250, 251, 255–258, 261
See application file for complete search history.

(56) References Cited

U.S. PATENT DOCUMENTS

| | | | |
|---|---|---|---|
| 5,359,767 A | * | 11/1994 | Chen ...................... H05K 3/462 174/266 |
| 5,716,663 A | | 2/1998 | Capote et al. |
| 6,931,723 B1 | | 8/2005 | Powell |
| 6,995,322 B2 | | 2/2006 | Chan et al. |
| 7,012,489 B2 | | 3/2006 | Sherrer et al. |
| 7,656,256 B2 | | 2/2010 | Houck et al. |
| 7,707,716 B2 | | 5/2010 | Song et al. |
| 2003/0127495 A1 | | 7/2003 | Curcio et al. |
| 2007/0163887 A1 | | 7/2007 | Hofmann |
| 2008/0121416 A1 | | 5/2008 | Hirai et al. |
| 2008/0217050 A1 | | 9/2008 | Egitto et al. |
| 2009/0185357 A1 | * | 7/2009 | Rendek, Jr. .......... H01H 13/704 361/762 |
| 2010/0230145 A1 | | 9/2010 | Holcomb |

OTHER PUBLICATIONS

Effenberg et al., "Non-Ferrous Metal Systems, Part 3," Chapter "Au—Cu—Sn (Gold-Copper-Tin)," vol. 11C3, pages, 2007, pp. 138-148.

\* cited by examiner

METHOD TO MAKE A MULTILAYER CIRCUIT BOARD WITH INTERMETALLIC COMPOUND AND RELATED CIRCUIT BOARDS

FIELD OF THE INVENTION

The present invention relates to the field of multilayer circuit fabrication, and, more particularly, to lamination of multilayer circuit boards and related circuit boards.

BACKGROUND OF THE INVENTION

An electronic device may include one or more circuit boards. A typical circuit board is a planar board that mechanically supports electronic components. The electronic components may comprise, for example, resistors, capacitors, switches, batteries, and other more complex integrated circuit components, i.e. microprocessors. The circuit board typically comprises a dielectric material, for example, a polymer material.

The circuit board may include conductive traces on the surface for connecting the electronic components to each other. As electronic circuitry has become more complex, multilayer circuit boards with at least two electrically conductive pattern layers have been developed. Typically, the different conductive trace layers of a multilayer circuit board may be connected through vertically extending vias, which comprise conductive materials, for example, metal.

A typical multilayer circuit board may comprise a plurality of core layers with bonding layers therebetween affixing the adjacent core layers together. Each core layer typically includes a dielectric layer with electrically conductive pattern layers on the opposing surfaces of the dielectric layer. Typically, during manufacture of the multilayer circuit boards, the core and bonding layers are stacked together and then heated (laminated) to cause the bonding layer to affix the adjacent core layers together.

In multilayer circuit board manufacturing, there are three typical categories for vias, i.e. a through-via, a buried via, and a blind-via. Quite simply, the through-via extends through all layers of a multilayer circuit board whereas a blind via terminates at one of the internal layers. Buried vias, on the other hand, connect two or more internal layers without providing connection to the external layers. In typical fabrication approaches, the formation of the blind-via may provide some technical hurdles for certain plating processes. In particular, the aspect ratio for the blind-via may need to be rather wide for plating techniques, for example, a 1:1 width to depth ratio. Accordingly, when traversing several layers, the blind-via may become necessarily large, which may undesirably consume circuit board real estate. In contrast, through-vias may be formed with more desirable aspect ratios, for example, 1:10 width to depth ratio.

Moreover, in typical multilayer circuit board approaches, the fabrication process includes multiple lamination steps and is onerous. Indeed, individual circuit board layers are typically laminated together sequentially, thereby adding substantial costs to the process by requiring registration and alignment at each sequential layer addition as well as multiple time consuming lamination steps.

For example, U.S. Patent Application No. 2008/0121416 to Hirai et al. discloses a multilayer circuit fabrication method. This method uses separate bonding layers with through-vias to connect circuit board layers and uses multi-step bonding methods. Also, U.S. Pat. No. 6,995,322 to Chan et al. discloses a method for making a multilayer circuit board. As in typical approaches, this method forms several separate portions of the finished multilayer circuit board in several lamination steps.

SUMMARY OF THE INVENTION

In view of the foregoing background, it is therefore an object of the present invention to provide an efficient method for making a multilayer circuit board.

This and other objects, features, and advantages in accordance with the present invention are provided by a method of making a multilayer circuit board from a plurality of circuit board layers, each comprising a dielectric layer and conductive traces thereon comprising a first metal. This method comprises forming through-via in a first circuit board layer, plating the through-via with the first metal, and coating a second metal onto the first metal of the first circuit board layer, the first metal of the plated through-via, and the first metal of a second circuit board layer. The method also includes aligning the first and second circuit board layers so that the plated through-via of the first circuit board layer is adjacent a feature, such as a plated through-via or a trace, on the second circuit board layer, and heating and pressing the aligned first and second circuit board layers so as to laminate the dielectric layers together and form an intermetallic compound of the first and second metals bonding adjacent metal portions together and defining electrical connection paths of the multilayer circuit board, thereby converting the through-vias to blind or buried vias. Advantageously, the first and second circuit board layers may be laminated with smaller diameter vias in one step.

More specifically, the method may comprise selecting the second metal to have a melting temperature below a lamination temperature of the dielectric layers. Also, the method may comprise selecting the first metal to have a melting temperature greater than a lamination temperature of the dielectric layers. For example, the first metal may comprise copper, and the second metal may comprise tin.

Another aspect is directed to a multilayer circuit board that includes a plurality of circuit board layers, each comprising a dielectric layer and conductive traces thereon comprising a first metal. The multilayer circuit board includes a first circuit board layer of the plurality thereof having a through-via therein, and a plating in the through-via comprising the first metal. The first circuit board layer and a second circuit board layer of the plurality thereof are relatively aligned so that the through-via of the first circuit board layer is adjacent a feature on the second circuit board layer, and laminated together. The multilayer circuit board includes adjacent portions of the conductive traces joined together by an intermetallic compound formed between the first metal and a second metal.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
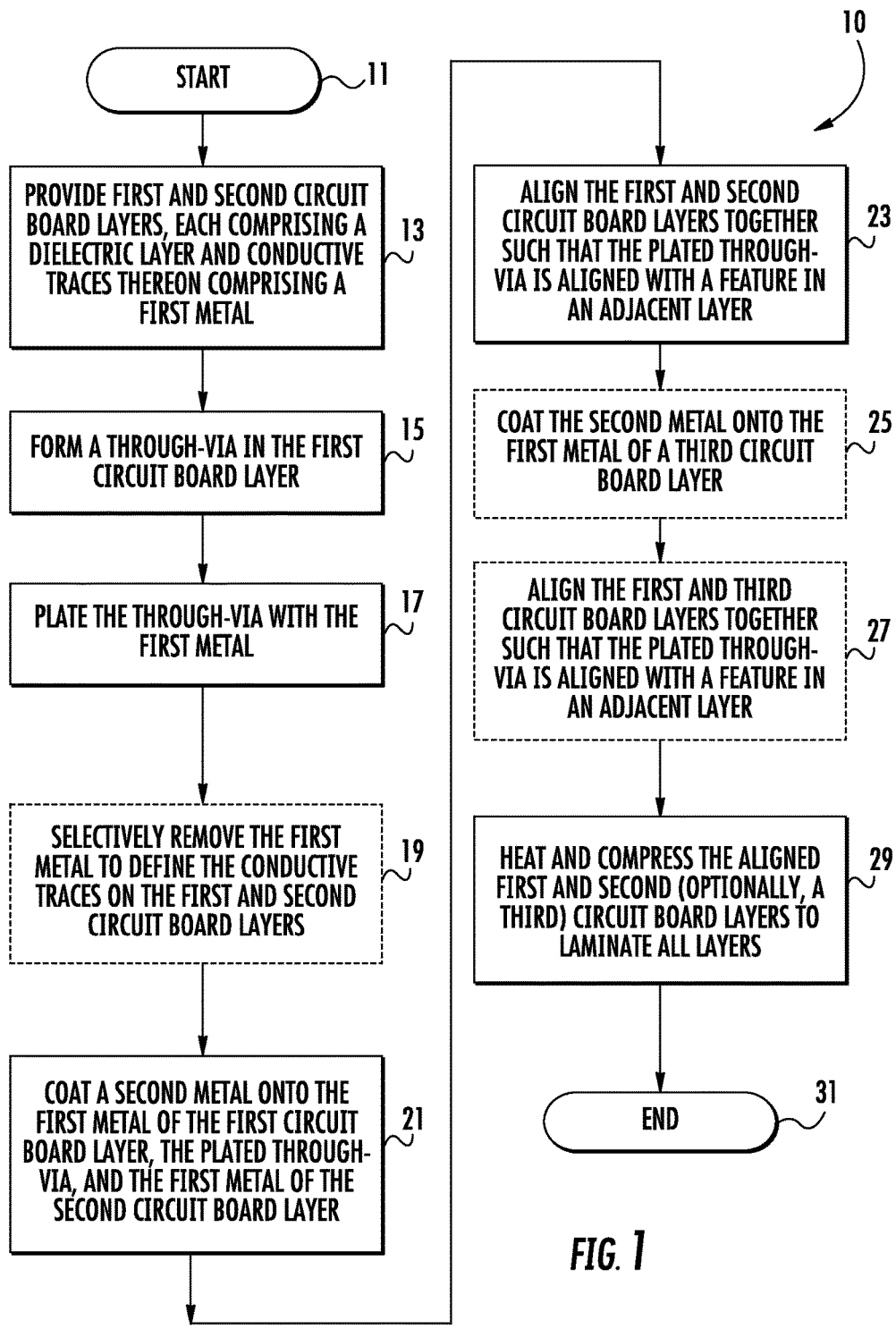
FIG. 1 is a flowchart illustrating a method, according to the present invention.
Figure 2A:
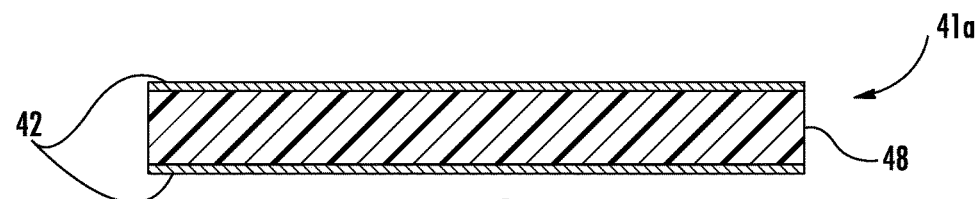
FIGS. 2A-2F are schematic cross-sectional views of the steps of the method of FIG. 1.
Figure 2B:
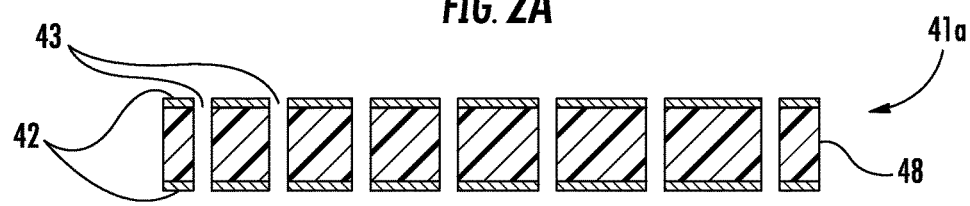
Figure 2C:
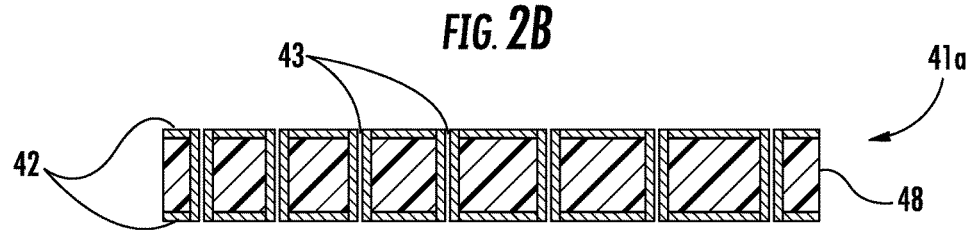
Figure 2D:
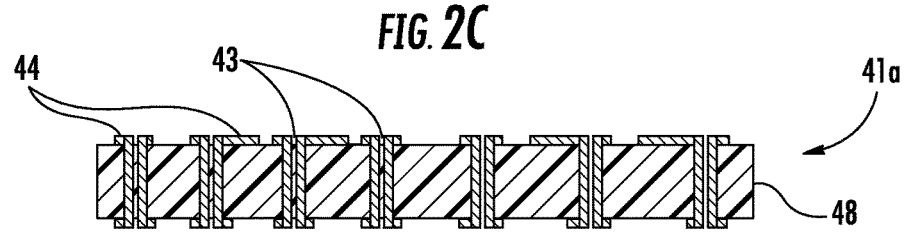
Figure 2E:
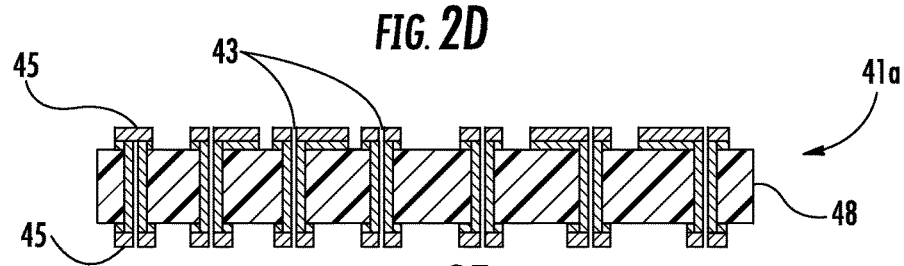
Figure 2F:
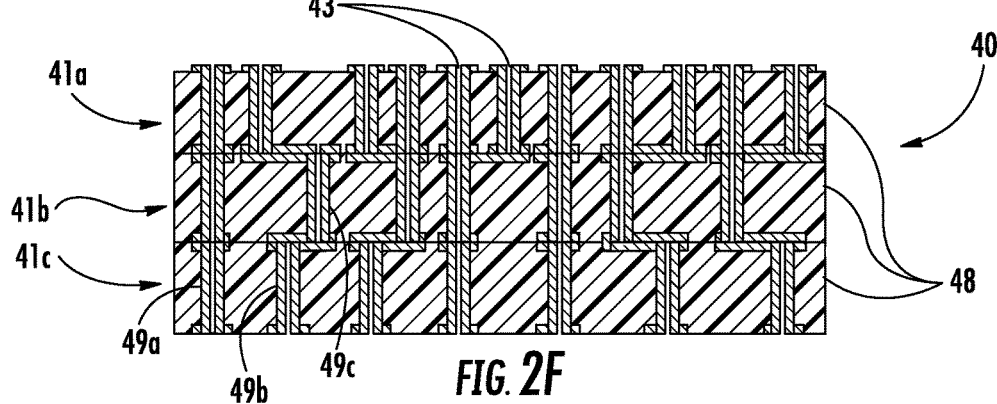

Referring initially to FIGS. 1-2F, a method of making a multilayer circuit board 40 according to the present invention is now described with reference to a flowchart 10. (Block 11). The method is for making the multilayer circuit board 40 from a plurality of circuit board layers 41a-41c. Each circuit board layer 41a-41c includes a dielectric layer 48 and first metal layers 42 on the major surfaces thereof. The dielectric layers 48 comprise thermoplastic materials. For example, the dielectric layers 48 may include biaxially-oriented liquid crystal polymer (LCP) layers, though other materials may be used, such as polyimide or Teflon.

For example, the first metal layer 42 may comprise copper. Also, the first metal has a melting temperature greater than a lamination temperature of the dielectric layers 48. The circuit board layers 41a-41c are clad with the first metal on both major surfaces thereof (Block 13).

This method further includes forming a plurality of through-vias 43 in a first circuit board layer 41a (Block 15). For ease of explanation, only the first circuit board layer 41a is shown in FIGS. 2A-E, but as will be appreciated by those skilled in the art, the second circuit board 41b (and in certain embodiments, the third circuit board layer 41c) is processed similarly. For example, the through-vias 43 may be formed using laser milling techniques, punch techniques, and mechanical drilling techniques, etc.

The method includes plating the through-vias 43 with the first metal (Block 17). For example, the first metal may be plated in the through-vias 43 using electrodeposition methods. The method includes selectively removing portions of the first metal layers 42 to define conductive traces 44 on the first and second circuit board layers 41a-41b from the first metal layers thereon (Block 19). For example, the first metal layers 42 may be removed using chemical etching and lithography. The removal of portions of the first metal layer 42 is shown with dashed lines, since this step is optional, for example, in the instance where a solid first metal plane is required on a specific layer.

The method includes coating a second metal 45 onto the first metal conductive traces 44 of the first circuit board layer 41a, the plated through-vias 43, and the first metal 42 of a second circuit board layer 41b (Block 21). It should be noted that the plating of the second metal 45 is not drawn to scale. More specifically, the second metal 45 has a melting temperature below a lamination temperature of the dielectric layers 48 and forms a stable intermetallic compound with the first metal 42 at a temperature below the lamination temperature. The second metal 45 may be formed using at least one of an electroless deposition process, an electrolytic deposition process, and a physical vapor deposition process. It is required that the intermetallic compound that is formed possess a melting temperature higher than any subsequent processing temperatures (such as, placing components on the finished circuit board and performing solder reflow). For example, the second metal 45 may comprise tin (tin melting point: 260° C.; LCP lamination temperature: 270° C.; copper-tin intermetallic compound melting point: 600° C.)

The method also includes aligning the first and second circuit board layers 41a-41b together to interconnect the adjacent layers using the plated through-vias 43 (Block 23), thereby creating blind 49b (FIG. 2F), stacked 49a (FIG. 2F), and/or buried vias 49c (FIG. 2F). The method includes heating and applying pressure to the aligned first and subsequent (illustratively three circuit board layers 41a-41c) circuit board layers 41a-41c so as to laminate the dielectric layers 48 together and form an intermetallic compound of the first and second metals bonding adjacent metal portions together and defining electrical connection paths of the multilayer circuit board 40 (Block 29). Advantageously, the multilayer circuit board 40 can be laminated using a single lamination cycle.

For example, in copper-tin embodiments, the intermetallic compound comprises an intermetallic copper-tin compound. It is preferred that the tin layer be coated onto the copper. In embodiments that use LCP dielectric layers, the aligned circuit board layers 41a-41c are, for example, subjected to 270° C. and 200 PSI (lamination temperature and pressure of one type of LCP). For example, the aligned first, second, and third circuit board layers 41a-41c may be laminated together in an autoclave, which advantageously provides for prevention of oxidation and uses isostatic pressure, which can prevent circuit board layer mis-registration and squeeze out, both of which can improve dimensional stability.

Figure 3:
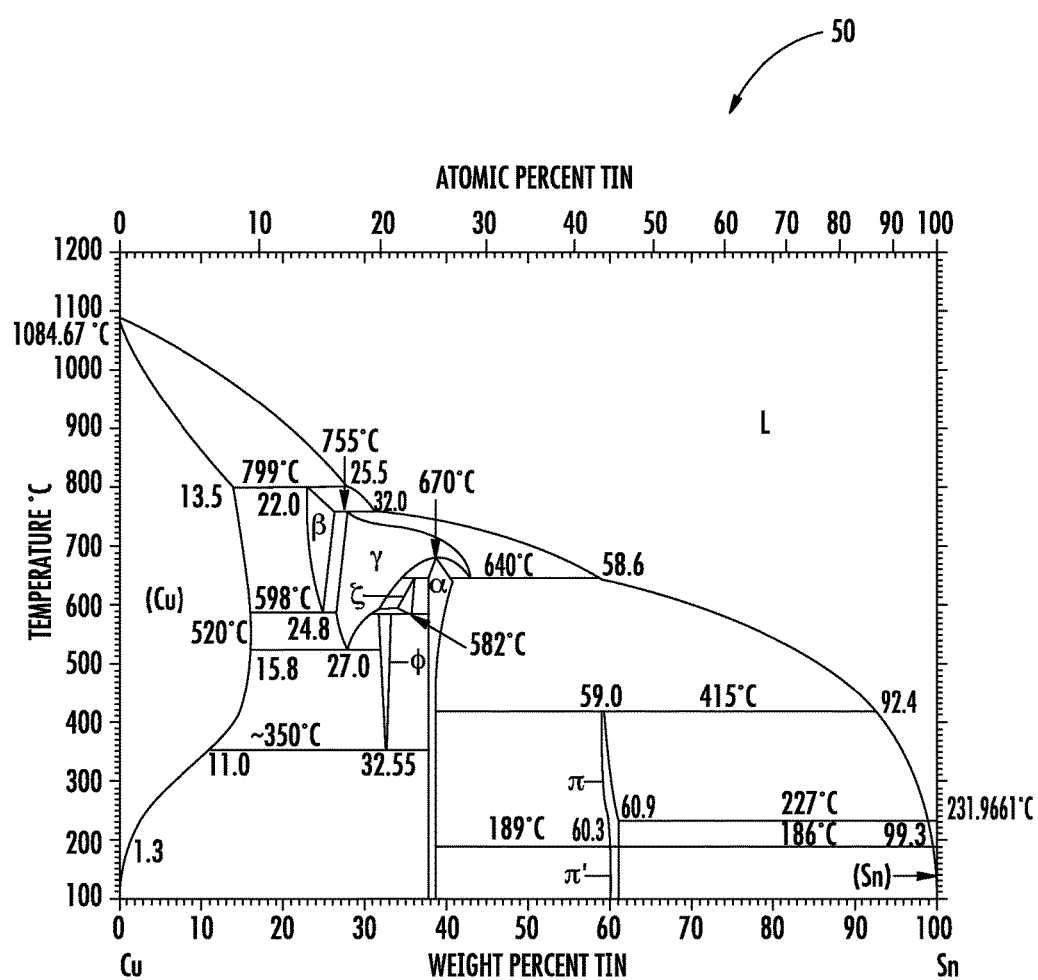
FIG. 3 is a phase diagram illustrating melting point characteristics for an embodiment of the intermetallic joint compound, according to the present invention.
Figure 4:
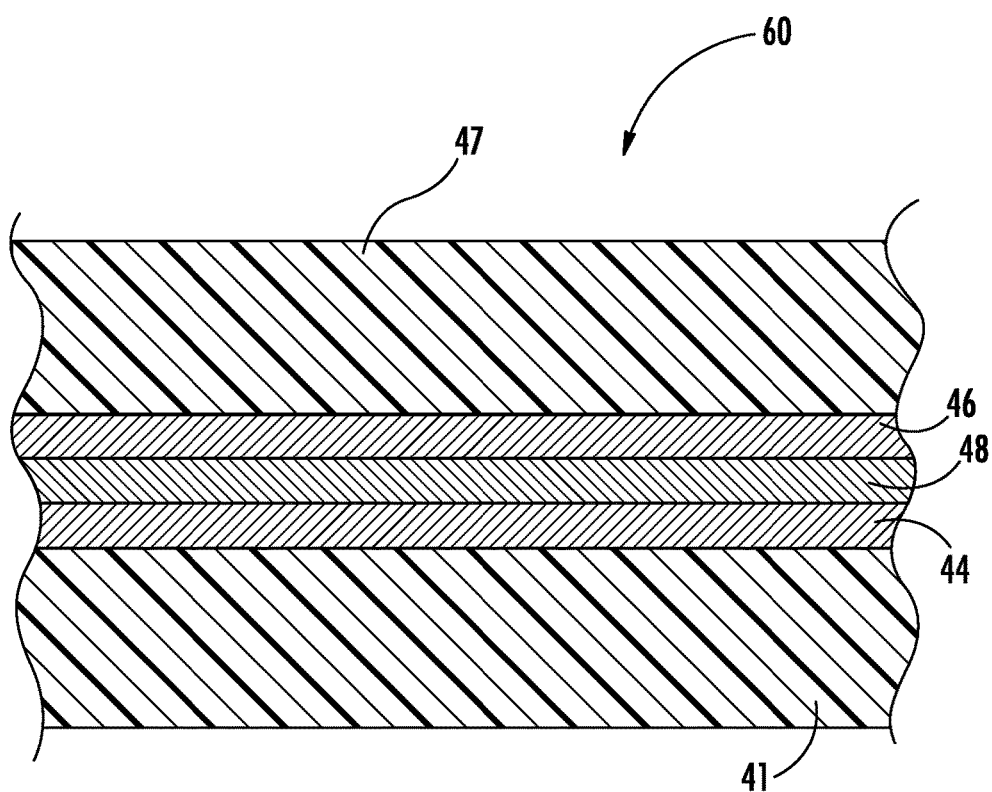
FIG. 4 is a cross-sectional view of an embodiment of the intermetallic joint compound, according to the present invention.

Referring now additionally to FIGS. 3-4, for embodiments including tin as the second metal and copper as the first metal, the intermetallic joint compound 60 comprises $Cu_3Sn$. Advantageously, this compound 60 is stable and has a melting point greater than 600° C. (intermetallic joint compound melting point characteristics as tin composition varies are shown in diagram 50). The intermetallic joint compound 60 is sandwiched between a bottom circuit board layer 41 and a top circuit board layer 47 and illustratively includes the copper conductive trace 44, a $Cu_3Sn$ layer 48, and a copper layer 46 from the opposing copper conductive trace. As illustrated, the heating and pressing substantially consumes the second metal 45 by the forming of the intermetallic compound 60 with the first metal.

In some embodiments, the method may include aligning the first circuit board layer 41a and the third circuit board layer 41c on an opposite side thereof (in relation to the second circuit board layer) (Blocks 25 & 27), also shown with dashed lines, aligning and interconnecting (on both sides of the first circuit board layer) some of the plated through-vias 43 of the first circuit board layer to define a buried-via 49c. In these embodiments, the third circuit board layer 41c is similarly formed as compared to the second and first circuit board layers 41a-41b, i.e. it comprises the dielectric layer 48, first metal conductive traces 44 thereon, and a second metal layer 45 on the first metal conductive traces. Of course, in these embodiments, the lamination step comprises heating and compressing the first, second, and third circuit board layers 41a-41c in one lamination step (Blocks 29 & 31).

Again, the above described method provides a single lamination fabrication method for the multilayer circuit board 40 that forms a stable and strong intermetallic electrical interconnect. Moreover, by forming blind-vias 49b, stacked-vias 49a, and buried-vias 49c from modified through-vias, the method overcomes the typical drawbacks of via formation in multilayer circuit boards (i.e. large blind via diameters and low aspect ratio). Being able to create all types of vias from through-vias and the precision that is afforded based on one step lamination allows for greater circuit densities and more efficient use of circuit board real estate.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A multilayer circuit board comprising:
   a plurality of circuit board layers, each comprising a dielectric layer and conductive traces thereon comprising a first metal;
   a first circuit board layer of said plurality thereof having a through-via therein;
   a plating in said through-via comprising the first metal;
   said first circuit board layer and a second circuit board layer of said plurality thereof being relatively aligned so that said through-via of said first circuit board layer is adjacent a feature on said second circuit board layer, and said first and second circuit board layers being directly laminated together without an adhesive material; and
   adjacent portions of said conductive traces being joined together by an intermetallic compound formed between the first metal and a second metal, the intermetallic compound having a melting temperature above a lamination temperature of the dielectric layers and comprising $Cu_3Sn$.

2. The multilayer circuit board according to claim 1 wherein the second metal has a melting temperature below the lamination temperature of said dielectric layers.

3. The multilayer circuit board according to claim 1 wherein the first metal has a melting temperature greater than the lamination temperature of said dielectric layers.

4. The multilayer circuit board according to claim 1 wherein the first metal comprises copper; and wherein the second metal comprises tin.

5. The multilayer circuit board according to claim 1 further comprising a third circuit board layer of said plurality thereof being relatively aligned and laminated to said first circuit board layer.

6. The multilayer circuit board according to claim 1 wherein each of said dielectric layers comprises a liquid crystal polymer (LCP) layer.

7. An electronic device comprising:
   a plurality of circuit board layers, each comprising a liquid crystal polymer (LCP) layer and conductive traces thereon comprising copper;
   a first circuit board layer of said plurality thereof having a through-via therein;
   a plating in said through-via comprising copper;
   said first circuit board layer and a second circuit board layer of said plurality thereof being relatively aligned so that said through-via of said first circuit board layer is adjacent a feature on said second circuit board layer, and said first and second circuit board layers being directly laminated together without an adhesive material; and
   adjacent portions of said conductive traces being joined together by an intermetallic copper-tin compound formed between copper and tin, the intermetallic copper-tin compound having a melting temperature above a lamination temperature of the LCP layers and comprising $Cu_3Sn$, the tin having a melting temperature below the lamination temperature of said LCP layers.

8. The electronic device according to claim 7 wherein copper has a melting temperature greater than the lamination temperature of said LCP layers.

9. The electronic device according to claim 7 further comprising a third circuit board layer of said plurality thereof being relatively aligned and laminated to said first circuit board layer.

10. An electronic device comprising:
    a plurality of circuit board layers, each comprising a dielectric layer and conductive traces thereon comprising a first metal;
    a first circuit board layer of said plurality thereof having a through-via therein;
    a plating in said through-via comprising the first metal;
    said first circuit board layer and a second circuit board layer of said plurality thereof being relatively aligned so that said through-via of said first circuit board layer is adjacent a feature on said second circuit board layer, and said first and second circuit board layers being directly laminated together without an adhesive material; and
    adjacent portions of said conductive traces being joined together by an intermetallic compound formed between the first metal and a second metal, the intermetallic compound having a melting temperature above a lamination temperature of the dielectric layers and comprising $Cu_3Sn$;
    the first metal having a melting temperature greater than the lamination temperature of said dielectric layers and the second metal having a melting temperature below the lamination temperature of said dielectric layers.

11. The electronic device according to claim 10 wherein the first metal comprises copper; and wherein the second metal comprises tin.

12. The electronic device according to claim 10 further comprising a third circuit board layer of said plurality thereof being relatively aligned and laminated to said first circuit board layer.

13. The electronic device according to claim 10 wherein each of said dielectric layers comprises a liquid crystal polymer (LCP) layer.

* * * * *